United States Patent [19]
Jeong et al.

[11] Patent Number: 5,414,404
[45] Date of Patent: May 9, 1995

[54] SEMICONDUCTOR DEVICE HAVING A THIN-FILM RESISTOR

[75] Inventors: Chang B. Jeong; Chang S. Song, both of Seoul, Rep. of Korea

[73] Assignee: Samsung Electronics Co., Ltd., Suweon, Rep. of Korea

[21] Appl. No.: 20,071

[22] Filed: Feb. 19, 1993

[30] Foreign Application Priority Data

Apr. 8, 1992 [KR] Rep. of Korea ............... 1992-5819

[51] Int. Cl.$^6$ ............................................. H01C 1/012
[52] U.S. Cl. ................................. 338/307; 338/309; 338/314
[58] Field of Search ............... 338/306, 307, 309, 314; 257/379, 536, 537, 538

[56] References Cited

U.S. PATENT DOCUMENTS

| | | | |
|---|---|---|---|
| 4,001,762 | 1/1977 | Aoki et al. | 338/309 |
| 4,575,923 | 3/1986 | Arnold | 437/46 |
| 4,600,658 | 7/1986 | Anderson et al. | 428/450 |
| 4,618,873 | 10/1986 | Sasano et al. | 257/52 |
| 4,656,496 | 4/1987 | Widlar | 257/567 |
| 4,756,927 | 7/1988 | Black et al. | 427/586 |
| 4,785,342 | 11/1988 | Yamanaka et al. | 257/379 |
| 4,975,386 | 12/1990 | Rao | 437/60 |
| 5,030,588 | 7/1991 | Hosaka | 437/60 |
| 5,083,183 | 1/1992 | Kobayashi | 257/537 |
| 5,128,745 | 7/1992 | Takasu et al. | 257/538 |
| 5,284,794 | 2/1994 | Isobe et al. | 437/173 |

*Primary Examiner*—Marvin M. Lateef
*Attorney, Agent, or Firm*—Charles R. Donohoe; Robert A. Westerlund, Jr.; Stephen R. Whitt

[57] ABSTRACT

A manufacturing method for a thin film resistor is disclosed. An insulating layer is formed on a substrate having a contact region. The insulating layer above the contact region is removed by etching to expose the contact region. A metal layer and an interlayer are then formed in sequence on the surface of the structure. The metal layer and the interlayer above the region where the resistor will be formed is next removed, and then a resistor layer is formed on the surface of the structure. The thin film resistor is completed by etching away the resistor layer except for the predetermined region where the resistor is to be formed.

6 Claims, 3 Drawing Sheets

SEMICONDUCTOR DEVICE HAVING A THIN-FILM RESISTOR

BACKGROUND OF THE INVENTION

1. FIELD OF THE INVENTION

The present invention relates to a manufacturing method of a thin film resistor, and more particularly, to a manufacturing method of a thin film resistor which can be constructed on an insulating layer and which is made of metal silicides having a low temperature coefficient of resistance ("TCR"), and in which sheet resistance can be easily controlled.

2. DESCRIPTION OF THE RELATED ART

Generally, the electrical characteristics of a resistor in an integrated circuit ("IC") are greatly dependent on a TCR that indicates thermal stability against thermal variations due to circumferential temperature changes or current flow. A high TCR indicates instability. Therefore, a resistor having a high TCR has a large variance of resistance values according to temperature changes, resulting in a poor quality IC. Accordingly, a resistor made of materials having a low or zero TCR is used in an IC which requires a precise resistivity.

Resistors are generally classified into three types. The first is a diffused resistor manufactured by doping impurities such as boron, phosphorous or arsenic into a silicon substrate. The second is a polysilicon resistor manufactured by doping impurities into polysilicon deposited on an insulating layer on a silicon substrate. Finally, the third is a thin film resistor manufactured by depositing metal silicides on an insulating layer on a silicon substrate and in which a desired resistance value is obtained by controlling the composition ratio of the metal silicides.

Of these IC resistors, the diffused resistor is not generally preferred because it has a low sheet resistance and therefore occupies a relatively wide area of a semiconductor substrate. The sheet resistance of the polysilicon resistor can controlled more easily and can be formed as multiple layers on an insulating layer, but has a high TCR.

The thin film resistor can control the sheet resistance easily and can be formed on the insulating layer. It also has a lower relative TCR. But the thin film resistor requires a barrier metal layer for preventing a thin film of metal silicides from oxidizing.

FIGS. 1A to 1E are cross-sectional views showing a conventional manufacturing process stages of a thin film resistor.

As seen from FIG. 1A, after a contact region 23 is formed on a semiconductor substrate 1 by a conventional method, an insulating layer 3 is formed on semiconductor substrate 1 by way of chemical vapor deposition ("CVD") or thermal oxidation. The insulating layer 3 is made of silicon oxide or silicon nitride. A resistor layer 11 and a interlayer 13 are formed on the insulating layer 3 by sputtering or CVD.

Preferably, the resistor layer 11 is made of metal silicides such as chromium or tantalum silicide and has a thickness of about 100 to 1000 Å. The interlayer 13 is made from a refractory metal, i.e., titanium, tungsten, cobalt, molybdenum or platinum, or their alloys. Interlayer 13 prevents the contact resistance of the resistor layer 11 from being increased by oxidation with metal. After that, a photoresist pattern 9 is formed on the interlayer 13 by a conventional photolithography method.

The interlayer 13 and the resistor layer 11 are sequentially removed by dry or wet etching except for the region masked by the photoresist pattern 9.

As seen from Fig. 1B, after the photoresist pattern 9 is removed, a photoresist layer 15 is formed on the surface of insulating layer 3, including the resistor layer 11 and the interlayer 13, which are thus not subsequently etched. Then, an opening 20 is formed through the photoresist layer 15 above the contact region 23. The insulating layer 3 is etched through this opening.

As seen from FIG. 1C, after the photoresist layer 15 is removed, a metal layer 17 is formed on the surface of the structure by depositing aluminum or an alloy thereof by way of sputtering to be in contact with the contact region 23.

As seen from FIG. 1D, after forming another photoresist layer 19 on the metal layer 17 by a conventional photolithography method, an opening 22 is formed therein above the metal layer 17 above the interlayer 13. Next, the portion of the metal layer 17 and the interlayer 13 under the window are removed by dry or wet etching.

As seen from FIG. 1E, after the photoresist 19 is removed, a conventional heat treatment is then applied to reduce the contact resistance between the resistor layer 11 and the interlayer 13, and between the interlayer 13 and the metal layer 17.

A passivation layer 21 is then formed on the surface of the structure by depositing an insulating material, such as boro-phospho silicate glass, phospho-silicate glass, or silicon nitride.

In a conventional manufacturing method of a thin film resistor, the contact resistance between the resistor layer and the metal layer is increased because a native oxide layer forms on the resistor layer exposed to air. Occasionally, the resistance can be decreased by forming an alloy with the metal layer. An interlayer should, in theory, solve these problems, but it increases production costs and complicates the etching processes of the metal layer and the interlayer. Moreover, because the oxide layer is not easily removed by hydrofluoride, it must removed by RF sputtering. The device's characteristics are thus degraded from the effect of RF sputtering on the exposed.

In addition, a native oxide layer forms on the semiconductor contact region 23, thereby insulating the metal layer 17 from the contact region 23. If the native oxide layer on the contact region is removed by hydrofluoride before depositing the metal layer 17 to solve the problem of insulation, then side-etching of the resistor layer 11 by the hydrofluoride necessarily occurs, which changes the resistance of the resistor layer.

FIGS. 2A to 2D are cross-sectional views showing a manufacturing process of another conventional thin film resistor, which is disclosed in Korean Patent Application No. 91-14613.

As seen from FIG. 2A, an insulator 33 is formed on a substrate 31. The insulator 33 is made of silicon oxide or silicon nitride and the substrate 31 is made of silicon or glass material, such as boro-phospho-silicate glass ("BPSG"), phospho silicate glass ("PSG"), or undoped silicate glass ("USG").

A metal layer 35 is formed on the insulator 33. The metal layer is made of aluminum or an alloy thereof. At this time, a metal oxide layer 36 forms on the metal layer 35 because the metal layer 35 exposed to air is quickly oxidized.

A photoresist layer 37, is formed on the metal layer 35, then removed from predetermined parts to provide an opening 28.

As seen from FIG. 2B, the native metal oxide layer 36 and the metal layer 35 are etched by dry or wet etching through the opening 28 to expose the insulating layer 33.

As seen from FIG. 2C, the photoresist layer 37 is removed, and the remaining metal oxide layer 36 on the metal layer 35 is removed by RF sputtering. Next, a resistor layer 39 of metal silicides such as chromium or tantalum silicide is deposited in-situ on the surface of the structure by physical deposition or CVD to define a resistor layer about 100 to 1000 Å thick. A photoresist pattern 41 is thereafter formed on the resistor layer 39. At this time, the resistor layer 39 may be exposed to air, but the resultant oxidation layer on the surface of the resistor layer 39 is less than 50 Å thick. It does not significantly influence the resistance value of the resistor layer 39 because the resistor layer 39 is in ohmic contact with the metal layer 35.

As seen from FIG. 2D, the resistor layer 39 is etched by utilizing the photoresist pattern 41 as a mask. The remaining resistor layer becomes the desired thin film resistor. The photoresist pattern 41 is next removed. The substrate 31 then undergoes heat treatment of about 400° to 450° C. to reduce the contact resistance between the newly etched resistor layer 40 and the metal layer 35. A newly etched passivation layer 43 is then formed on the surface of the structure by an insulating material of glass, such as BPSG, PSG or USG.

According to the conventional thin film resistor described above, the metal layer formed under the resistor layer is either corroded or eroded, or the metal layer is etched at the time of the etching of the resistor layer, thereby causing defects in the metal interconnection layer.

SUMMARY OF THE INVENTION

An object of the present invention is to provide a manufacturing method of a thin film resistor by which deterioration of the resistor layer and the operational device characteristics during etching and heat treatment can be prevented.

As described hereinafter, an insulating layer is formed on a substrate provided with a contact region. The insulating layer above the contact region is removed by etching to expose the contact region to air. A metal layer and an interlayer are then formed in sequence on the surface of the structure. The metal layer and the interlayer above the area where the resistor is to be formed is next removed. A resistor layer is then formed on the surface of the structure. The thin film resistor is completed by etching away the resistor layer, except for the predetermined area for forming the resistor thereon.

Accordingly, the contact region is protected from exposure to argon plasma, thereby preventing deterioration of device characteristics. (RF sputtering is used to remove a native oxide layer which spontaneously forms on the interlayer.) Moreover, poor contact between the resistor layer and the interlayer is avoided. In addition, the metal layer is protected by the interlayer when the resistor layer is etched, thereby preventing damage to the metal layer. Additionally, the interlayer formed on the metal layer reduces the formation of surface irregularities formed during heat treatment, thereby avoiding a poor quality metal layer.

The objects and features of the present invention will become more apparent from a consideration of the following description with reference to the accompanying drawings, in which a selected embodiment is illustrated by way of example, and not by way of limitation.

DETAILED DESCRIPTION OF THE PREFERRED EMBODIMENT

A preferred embodiment of a thin film resistor according to the present invention will be described in detail with reference to the appended drawings.

FIGS. 3A to 3F will be used to describe a manufacturing process of a thin film resistor according to the present invention. As seen from FIG. 3A, an insulating layer 55 is formed on a semiconductor substrate 51 by thermal oxidation or a CVD method after a contact region 53 is formed in the substrate 51 by a conventional technique. A photoresist layer 57 is then formed on the whole surface of the structure.

Figure 1A:
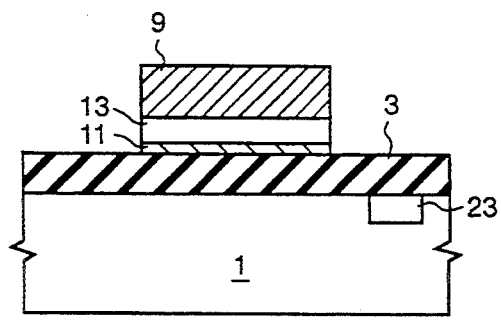
FIGS. 1A to 1E are cross-sectional views showing a manufacturing process of a conventional thin film resistor.
Figure 1B:
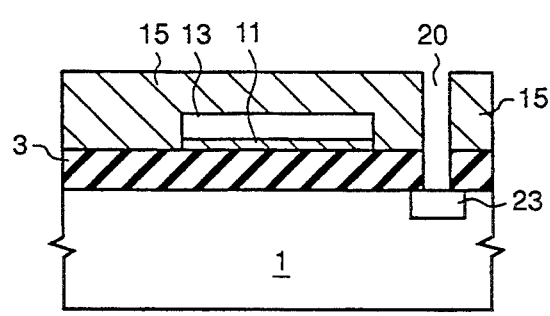
Figure 1C:
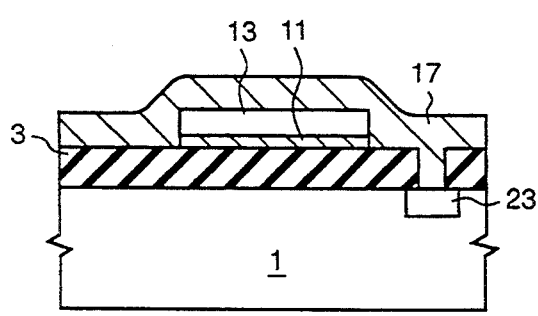
Figure 1D:
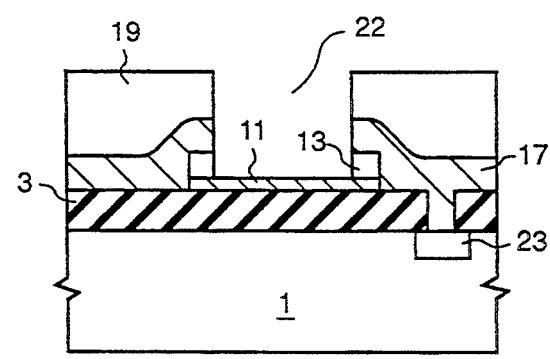
Figure 1E:
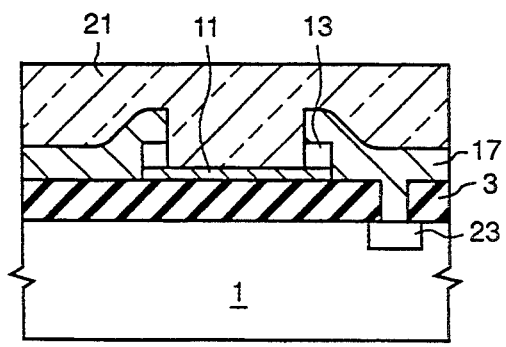
Figure 2A:
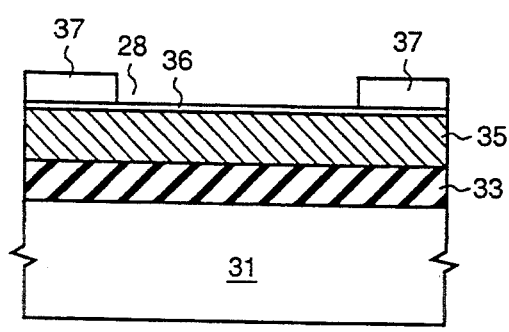
FIGS. 2A to 2D are cross-sectional views showing a manufacturing process of another conventional thin film resistor.
Figure 2B:
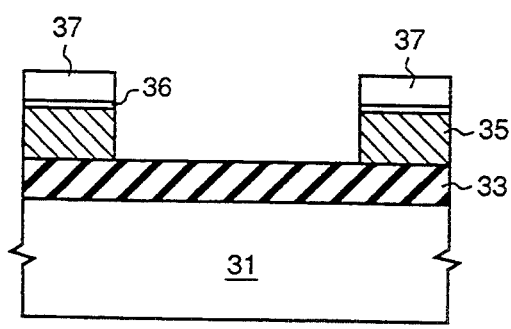
Figure 2C:
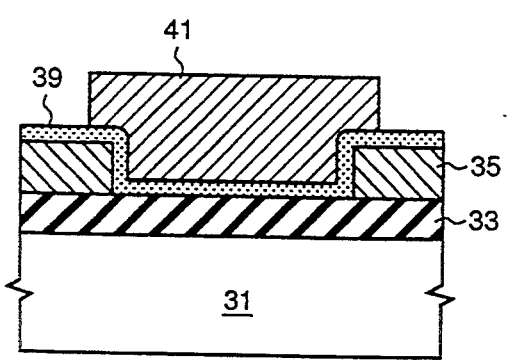
Figure 2D:
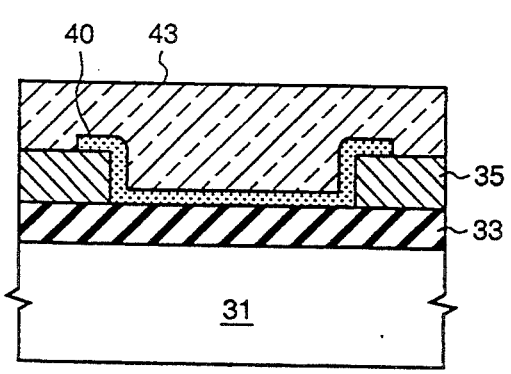
Figure 3A:
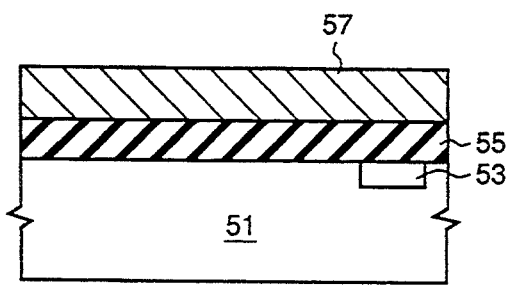
FIGS. 3A to 3F are cross-sectional views illustrating a manufacturing process of a thin film resistor according to the present invention.
Figure 3B:
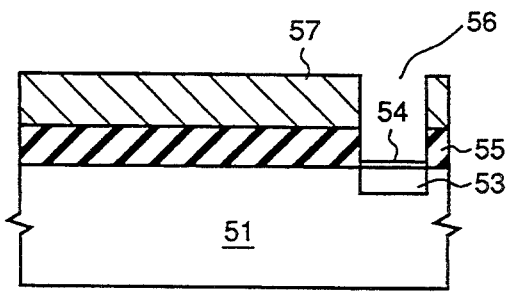

As seen from FIG. 3B, an opening 56 is formed in photoresist layer 57 above the contact region 53 by a conventional photolithography method. The exposed part of the insulating layer 55 is then removed by dry or wet etching using the photoresist layer 57 as a mask, thereby forming a contact opening for exposing the contact region 53. A native oxide layer 54 which forms on exposure to air is removed by wet or dry etching. Photoresist layer 57 is removed thereafter.

Figure 3C:
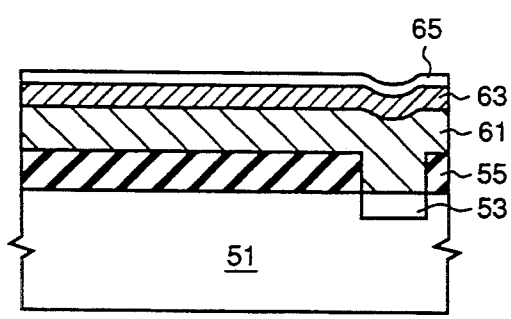

As seen from FIG. 3C, a metal layer 61, made of aluminum or an alloy thereof, is formed on the surface of the structure by physical deposition. An interlayer 63, made of a refractory metal such as titanium, tungsten, or platinum, or alloys thereof, is then formed on the metal layer 61, also by physical deposition. At this time, because the interlayer 63 oxidizes quickly when exposed to air, a native oxide layer 65 forms thereon.

Figure 3D:
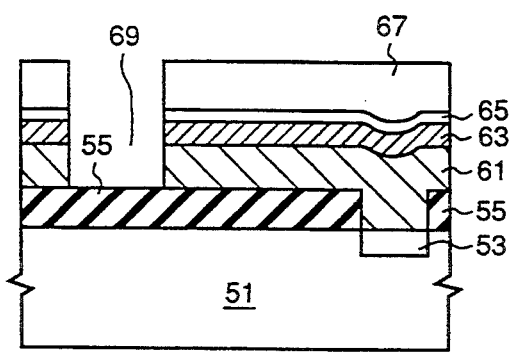

As seen from FIG. 3D, an opening is next formed at a predetermined part after a photoresist layer 67 is formed on the native oxide layer 65. The native oxide layer 65, the interlayer 63 and the metal layer 61 are sequentially removed through the opening by dry or wet etching so as to provide an aperture 69 for forming a resistor layer.

Figure 3E:
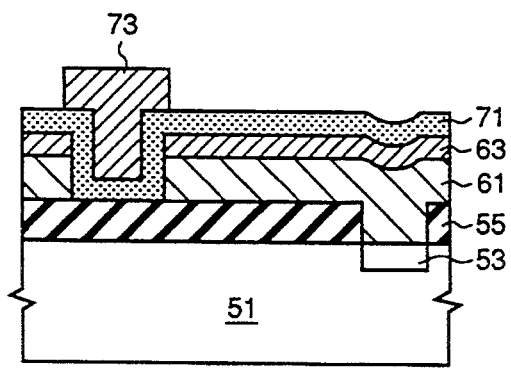

As seen from FIG. 3E, the remaining photoresist layer 67 is removed. The remaining native oxide layer 65 is then subsequently removed by RF sputtering. At this time, no deterioration in the device's characteristics occurs because the contact region 53 protected by the metal layer 61 and interlayer 63, and is therefore not exposed to argon plasma. A resistor layer 71 made of metal silicides, such as chromium or tantalum silicide, is then deposited in-situ on the surface of the structure by physical deposition or CVD. A photoresist pattern 73 is then formed on the resistor layer 71, above the aperture 69.

Figure 3F:
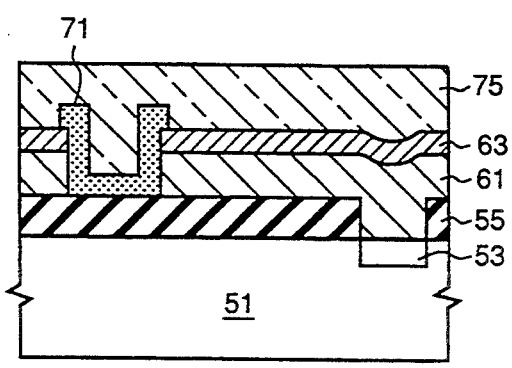

As seen from FIG. 3F, the exposed resistor layer 71 is removed by dry or wet etching, using the photoresist pattern 73 as a mask. At this time, the metal layer 61 is not damaged by this etching step because the interlayer 63 is therebetween. The resistor layer 71 in the aperture 69 which is thusly etched becomes the final desired thin film resistor. The photoresist pattern 73 is removed, and the substrate 51 undergoes heat treatment at about 400° to 50° C. so as to reduce contact resistance between the metal layer 61 and the interlayer 63, and between the interlayer 63 and the resistor layer 71. A passivation layer 75 made of an insulating material, such as silicon oxide, silicon nitride, BPSG, PSG or USG is formed on the surface of the structure.

As indicated above, the present invention is advantageous when RF sputtering is used to remove the native oxide layer 65, as described with reference to FIG. 3E, the contact region is protected from exposure during RF sputtering, thereby preventing deterioration of device characteristics.

Moreover, the present invention is advantageous in that poor contact between the resistor layer 71 and the interlayer 63 is avoided, as illustrated in FIG. 3F. The metal layer 61 is also protected by the interlayer 63 during etching of the resistor layer, thereby preventing damage to the metal layer.

Additionally, the present invention is also advantageous because the interlayer formed on the metal layer reduces the formation of surface irregularities formed on the metal layer during heat treatment, thus avoiding a poor quality metal layer.

The present invention is in no way limited to the embodiments described hereinabove. Various modifications of the present invention will become apparent to persons skilled in the art upon reference to the description of the present invention. Therefore, the appended claims cover any such modifications or embodiments as fall within the true scope of the present invention.

What is claimed is:

1. A thin film resistor comprising:
   (a) a semiconductor substrate having a contact region;
   (b) an insulating layer formed over said semiconductor substrate, wherein said insulating layer contains a contact opening over said contact region, thereby leaving a portion of said contact region exposed;
   (c) a two part metal layer formed over said insulating layer, wherein a first part of said metal layer contacts said contact region through said contact opening and said first and second parts of said metal layer are spaced apart and thereby electrically isolated from each other, said first and second metal parts of said metal layer including first and second end portions, respectively;
   (f) a resistor layer formed between said first and second metal layer parts, thus establishing an electrical path between said first and second metal layer parts;
   (g) an interlayer formed over each of said first and second end portions such that each interlayer is formed between each metal layer end portion disposed below said interlayer and a corresponding resistor portion formed above said interlayer; and
   (h) a passivation layer formed over said interlayer.

2. A thin film resistor according to claim 1, wherein said insulating layer is made of a material selected from the group consisting of silicon oxide and silicon nitride.

3. A thin film resistor according to claim 1, wherein said metal layer is made of material selected from the group consisting of an aluminum and alloys thereof.

4. A thin film resistor according to claim 1, wherein said interlayer is made of material selected from the group consisting of titanium, tungsten, platinum, and alloys thereof.

5. A thin film resistor according to claim 1, wherein said resistor layer is made of material selected from the group consisting of chromium, tantalum, and alloys thereof.

6. A thin film resistor according to claim 1, wherein said passivation layer is made of an insulating material selected from the group consisting of silicon oxide, silicon nitride, borophosphosilicate glass, phosphosilicate glass, and undoped silicate glass.

* * * * *